United States Patent [19]

Wong

[11] Patent Number: 5,393,700
[45] Date of Patent: Feb. 28, 1995

[54] METHODS TO FABRICATE LARGE HIGHLY REFLECTIVE METAL REFLECTOR PLATES FOR APPLICATIONS IN GAME CHIPS OR SIMILAR VIRTUAL IMAGE PROJECTION USE

[75] Inventor: George Wong, Singapore, Singapore

[73] Assignee: Chartered Semiconductor Manufacturing Pte Ltd., Singapore, Singapore

[21] Appl. No.: 231,503

[22] Filed: Apr. 22, 1994

[51] Int. Cl.[6] .............. H01L 21/44; H01L 21/48
[52] U.S. Cl. .............................. 437/187; 437/190; 437/192
[58] Field of Search ............... 437/187, 190, 192, 194, 437/195

[56] References Cited

U.S. PATENT DOCUMENTS

| 4,603,258 | 7/1986 | Sher et al. | 250/370 |
| 4,720,908 | 1/1988 | Wills | 437/192 |
| 5,225,372 | 7/1993 | Savkar et al. | 437/190 |
| 5,270,255 | 12/1993 | Wong | 437/194 |

OTHER PUBLICATIONS

IEEE Spectrum, Oct. 1993, pp. 22–40, "Special Report-Virtual Reality is For Real".

Primary Examiner—Olik Chaudhuri
Assistant Examiner—C. Everhart
Attorney, Agent, or Firm—George O. Saile; Stephen B. Ackerman

[57] ABSTRACT

A method, and resultant structure, for manufacturing large highly reflective metal reflector plates on an integrated circuit chip, for applications in game chips or similar virtual image projection systems, is described. A metal interconnection layer is formed above a semiconductor substrate, an intermetal dielectric layer is formed on the metal interconnection layer, and an opening is made through the intermetal dielectric layer to expose a portion of the metal interconnection layer. A first metal layer is formed on the intermetal dielectric layer and connecting to the metal interconnection layer through the opening. A second metal layer is formed on the first metal layer. A third metal layer is formed on the second metal layer. A highly reflective metal layer is formed on the third metal layer. The the first, second, third and highly reflective metal layers are patterned to form the highly reflective metal reflector plate. A passivation layer is formed over the highly reflective metal reflector plate and exposed surface of the intermetal dielectric layer. The passivation layer is etched above the highly reflective metal reflector plate to leave a portion of the passivation layer over the entire top surface of the highly reflective metal reflector plate. The portion of the passivation layer is removed with a wet etch, to expose the highly reflective metal reflector plate.

26 Claims, 4 Drawing Sheets

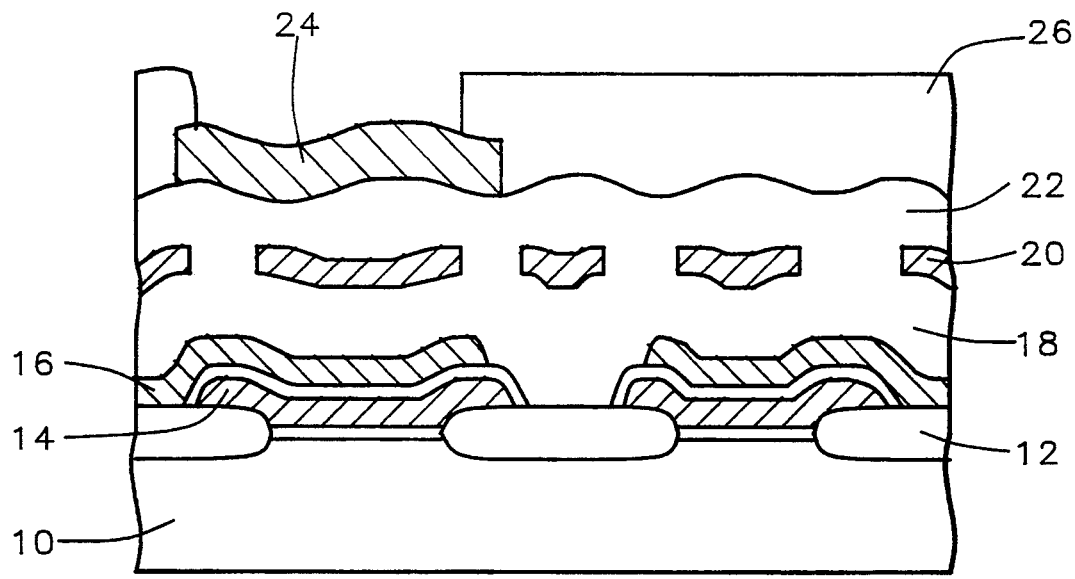
FIG. 1 - Prior Art
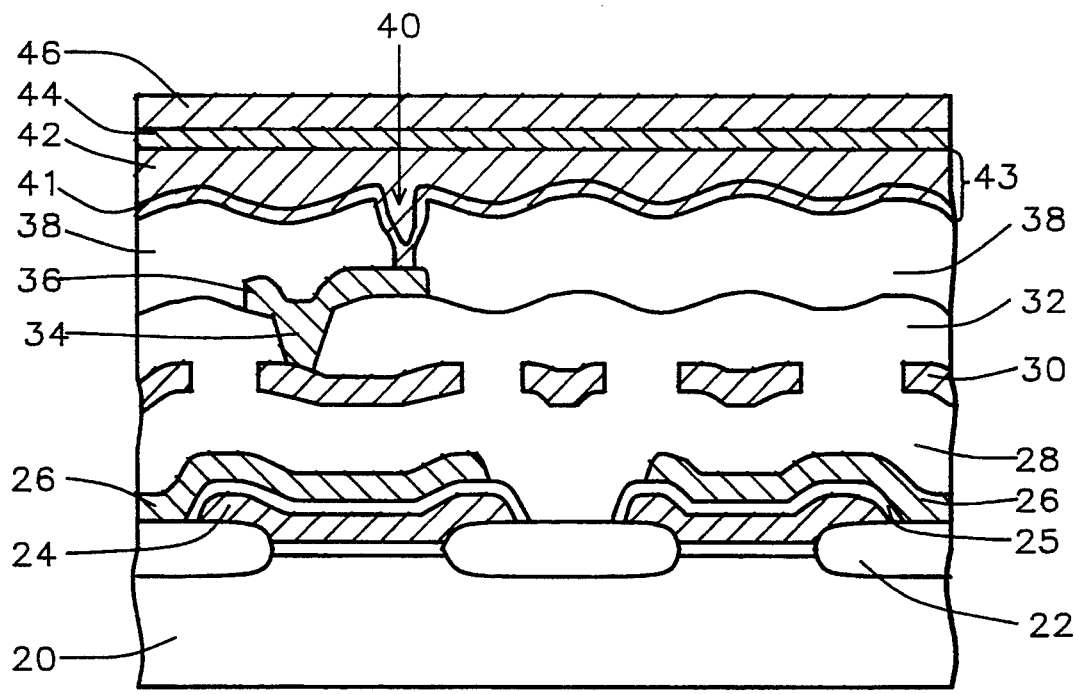
FIG. 2

METHODS TO FABRICATE LARGE HIGHLY REFLECTIVE METAL REFLECTOR PLATES FOR APPLICATIONS IN GAME CHIPS OR SIMILAR VIRTUAL IMAGE PROJECTION USE

BACKGROUND OF THE INVENTION

1. Field of the Invention

The invention relates to reflective surfaces for use in virtual reality display devices, and more particularly to a method for making large highly reflective metal reflector plates for applications in game chips or similar virtual image projection systems.

2. Description of the Related Art

Large reflective surfaces on integrated circuits are needed for applications such as virtual reality display devices. IEEE Spectrum, October 1993, pages 22–40 "Special Report: Virtual Reality is for Real" covering several papers, gives a general discussion of current virtual reality technology, wherein a very natural interface between humans and computers is created. Communication between a human and computer can take the form of moving 3-dimensional imagery, spatial sounds and even physical forces from motion to touching.

There is currently a need to provide large reflective metal, or the like, surfaces on the surface of integrated circuit memory chips for use in virtual reality display devices. I/O (Input/Output) pads with large metal surfaces are currently used on integrated circuit chips, but are not nearly large enough for a reflective metal area for virtual reality display purposes. Nor are I/O pads reflective enough to be used as reflective surfaces. Current capability for specularity, the degree of light that is scattered, is only 2%, while a specularity of about 80% is desirable.

In the prior art structure shown in FIG. 1, a memory cell has been formed on semiconductor substrate 10, including field oxide isolation regions 12, polysilicon layers 14 and 16, all formed as is well known in the art. An insulating layer 18 is formed on second polysilicon layer 16 and in openings in the polysilicon. This layer is formed of typically silicon oxide or the like. A first metal layer 20 is deposited and patterned, is typically of aluminum and is used for interconnection of devices to each other and to input/output pads. An intermetal dielectric (IMD) layer 22 is deposited over and between metal layer 20. It will be noted that each successive layer's top surface is uneven, due to the uneven surface on which the layers are deposited. A second metal layer is now deposited on the IMD layer and is typically aluminum. This metal layer is then patterned to form a metal pad 24, for I/O purposes and the like, and a passivation layer 26 is deposited and patterned above it to expose the metal pad. As shown in FIG. 1, the top surface is rough and uneven, due to the uneven nature of the top surface of the IMD layer beneath it, and due to the metal layer itself. The metal top surface is unacceptable for a reflector plate, but is adequate for I/O pads and the like, as the uneven surface will cause destructive interference of light waves impacting on the plate.

SUMMARY OF THE INVENTION

It is therefore an object of this invention to provide a very manufacturable method for fabricating, and a resulting structure of, a large, highly reflective metal reflector plate for virtual image projection applications.

This object is achieved by forming a metal interconnection layer above a semiconductor substrate, an intermetal dielectric layer on the metal interconnection layer, and an opening through the intermetal dielectric layer to expose a portion of the metal interconnection layer. A first metal layer is formed on the intermetal dielectric layer and connecting to the metal interconnection layer through the opening. A second metal layer is formed on the first metal layer. A third metal layer is formed on the second metal layer. A highly reflective metal layer is formed on the third metal layer. The the first, second, third and highly reflective metal layers are patterned to form the highly reflective metal reflector plate. A passivation layer is formed over the highly reflective metal reflector plate and exposed surface of the intermetal dielectric layer. The passivation layer is etched above the highly reflective metal reflector plate to leave a portion of the passivation layer over the entire top surface of the highly reflective metal reflector plate. The portion of the passivation layer is removed with a wet etch, to expose the highly reflective metal reflector plate.

BRIEF DESCRIPTION OF THE DRAWINGS

FIG. 1 is a cross-sectional view of a metal structure using a prior art process in which the top surface is not sufficiently smooth for light reflection.

FIG. 2 to 6 are cross-sectional views of the method of the invention for manufacturing a large, highly reflective metal reflector plate.

DESCRIPTION OF THE PREFERRED EMBODIMENTS

Figure 3:
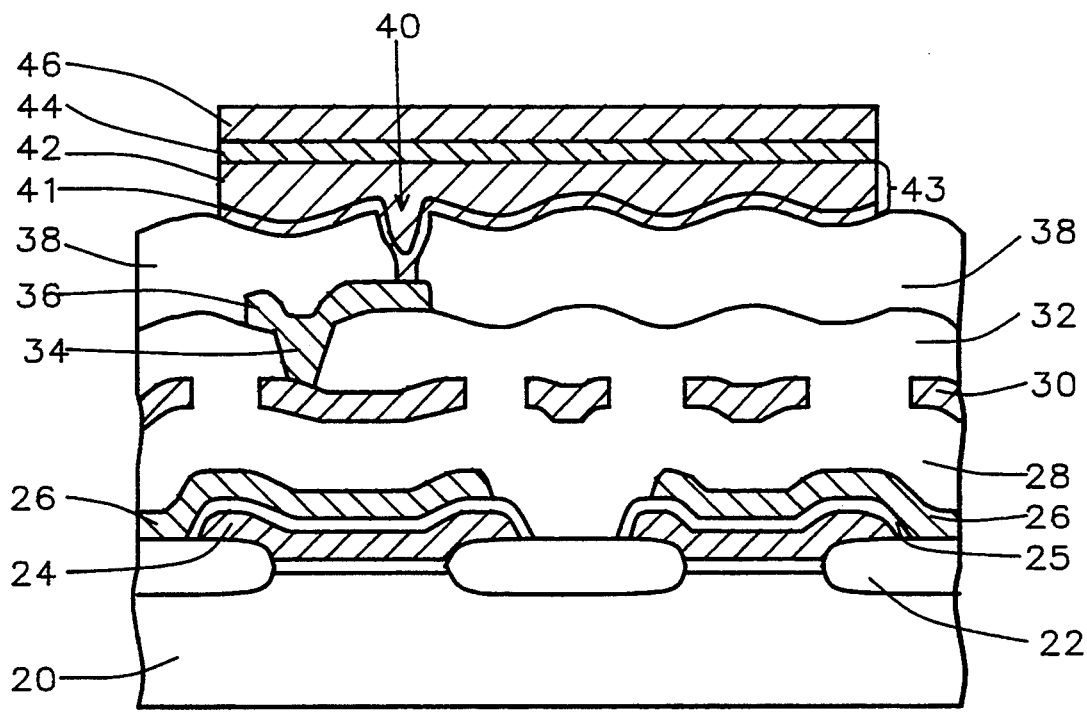

Referring now to FIG. 2, a memory cell, e.g., a DRAM (Dynamic Random Access Memory), SRAM (Static Random Access Memory), EEPROM (Electrically Eraseable Programmable Read Only Memory), ROM (Read Only Memory), etc., has been formed on semiconductor substrate 20. The memory cell can be industry standard, and the large reflector plate to be formed above it is independent of the underlying cell. Field oxide isolation regions 22 are formed by, for instance, LOCOS (LOCal Oxidation of Silicon), as is well known in the art. Polysilicon layers 24 and 26 are formed with an intermediate dielectric layer 25, are formed and patterned as is well known in the art. These are a general representation of the underlying memory cell and are an example only. An insulating layer 28 is formed on second polysilicon layer 26 and in openings in the polysilicon. This layer is formed typically of silicon oxide or the like. An initial metal layer 30 is deposited and patterned and is typically aluminum. This layer is patterned into lines for interconnection of devices to each other and to input/output pads. A first IMD layer 32 is deposited over and between metal layer 30. It will be noted that each successive layer's top surface is uneven, due to the uneven surface on which the layers are deposited.

Openings are formed for vias in IMD layer 32 for interconnection of the subsequent metal layer to first metal 30. Another metal layer 36 is deposited on IMD layer 32 and is typically aluminum. The metal plate of the invention could be formed at this layer, or any subsequent layer, of metallization, but will be described as being formed at the third metallization layer. Metal 36 fills via 34 during deposition, and is then patterned as desired to form additional metal lines. Second IMD layer 38 is formed on the top surfaces of second metal 36 and first IMD layer 32. This layer is formed of an SOG (Spin On Glass) combination for planarization. Planarization of this layer is performed by one of two methods, but must be low temperature (less than about 400° C.) to avoid adverse affect to the aluminum reflective surface. Planarization can be by oxide/SOG/oxide, or oxide and chemical/mechanical polishing (CMP). Openings are formed in second IMD layer 38 to expose portions of second metal layer 36 for further interconnection. This is shown as via 40 in FIG. 2.

In the next critical steps of the invention, the metal layers for the metal reflector plate structure are formed. A metal layer 43, the bottom layer of the reflector plate structure, is now formed on IMD 38 and to fill via 40. This layer is formed of aluminum, deposited by a two-step process: (1) A cold layer 41 sputtered aluminum layer is deposited to a thickness of between about 1500 and 2000 Angstroms, at a temperature of between about 100° and 200° C., preferred temperature of less than 150° C., at a power of between about 5 and 10 kilowatts. (2) A hot layer 42 sputtered aluminum at a temperature of between about 475 and 550 Angstroms, to a thickness of between about 2000 and 5000 Angstroms, at a power of between about 5 and 10 kilowatts.

The top surface of layer 43 is still too rough a surface for reflection, due to a large grain size of between about 3 and 10 micrometers. To overcome this roughness, a third metal layer 44 is deposited. This layer is formed of Ti (titanium) or TiN (titanium nitride), or the like, which is cold sputtered to provide a small grain size layer from which the final cold Al layer will be seeded. The thickness of layer 44 is between about 400 and 800 Angstroms.

The fourth, and top, layer 46 of the metal reflector structure is formed of cold aluminum, deposited by one of two methods: (1) by sputtering Al cold set at room temperature, or about 20° C., however the wafer will be heated up to about 50° C. The thickness is between about 2000 and 5000 Angstroms, and must be thick enough to even out roughness. (2) By any type of Al e-beam or evaporation. The grain size of this layer is less than about 0.5 micrometers, using either deposition method. Deposition at this temperature results in metal 46 being a fine-grain, highly reflective film. Aluminum layer 46 is pure aluminum, as any of the common additive materials such as Si or Cu (copper) could cause undesirable hillock growth during subsequent higher temperature processing, which would reduce the reflectivity of the top Al layer.

Figure 7:
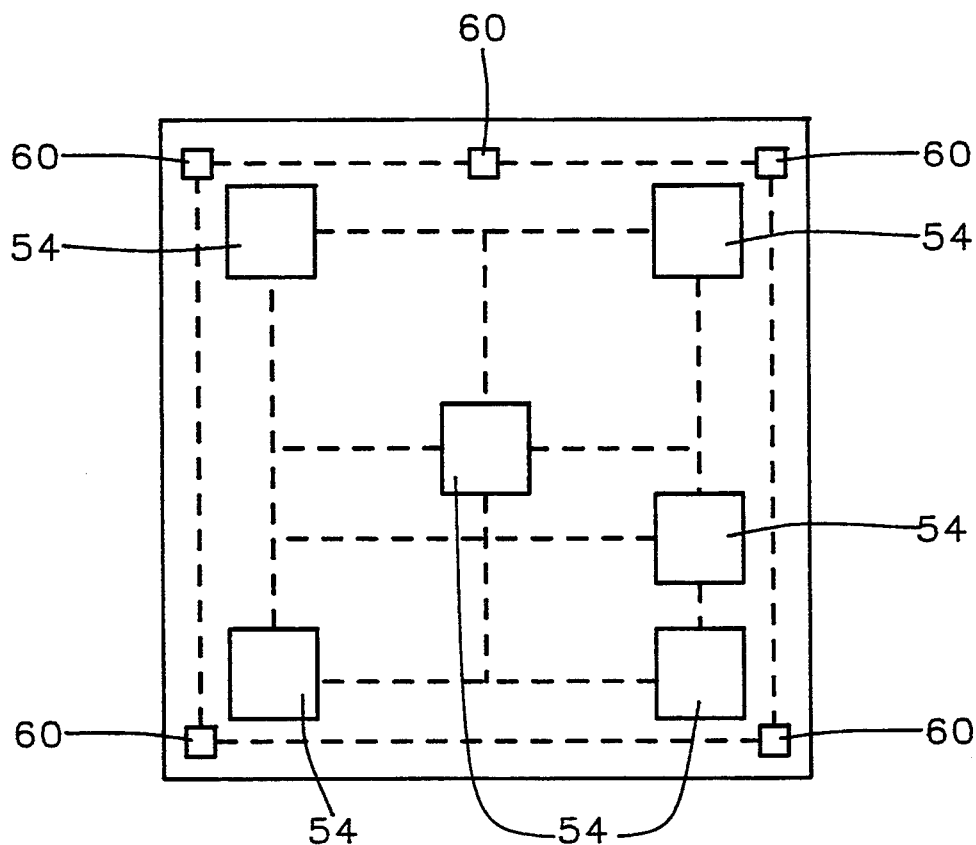
FIG. 7 is a schematic top view of the reflective metal plate of the invention on an integrated circuit chip having I/O pads at the periphery.

Referring now to FIG. 3, the top metal sandwich structure is etched to the desired size of the metal reflector plate. The plate dimensions are such that many reflective areas 54, as shown in the top view of FIG. 7, are formed on the integrated circuit within the surrounding bonding pads 60. The desired plate is defined by a photoresist formed by conventional lithography. The metal etch may be accomplished by either reactive ion etching, or a wet etch. A wet etch is accomplished with chemical species $BCl_3$ and $Cl_2$ (boron trichloride and chlorine). The resist is then stripped using standard stripping techniques.

Figure 4:
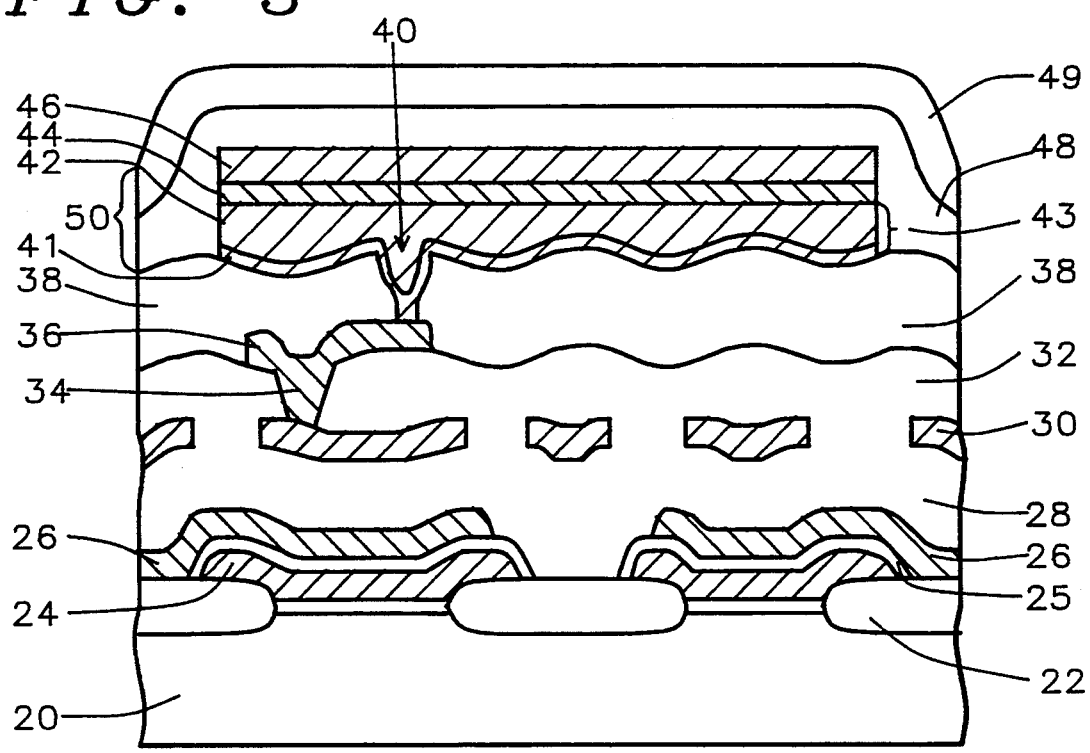

With reference to FIG. 4, passivation layer 50 is added as a final layer. This layer is formed of a sandwich of $SiO_x$ layer 48, which is a phosphosilicate glass (PSG) with 2–3% phosphorus, and $Si_3N_4$ (silicon nitride) layer 49. Each of these two layers is formed by PECVD (Plasma Enhanced Chemical Vapor Deposition) at less than 400° C. so that deposition would take about one minute each, to a thickness of between about 3000 and 5000 Angstroms.

Figure 5:
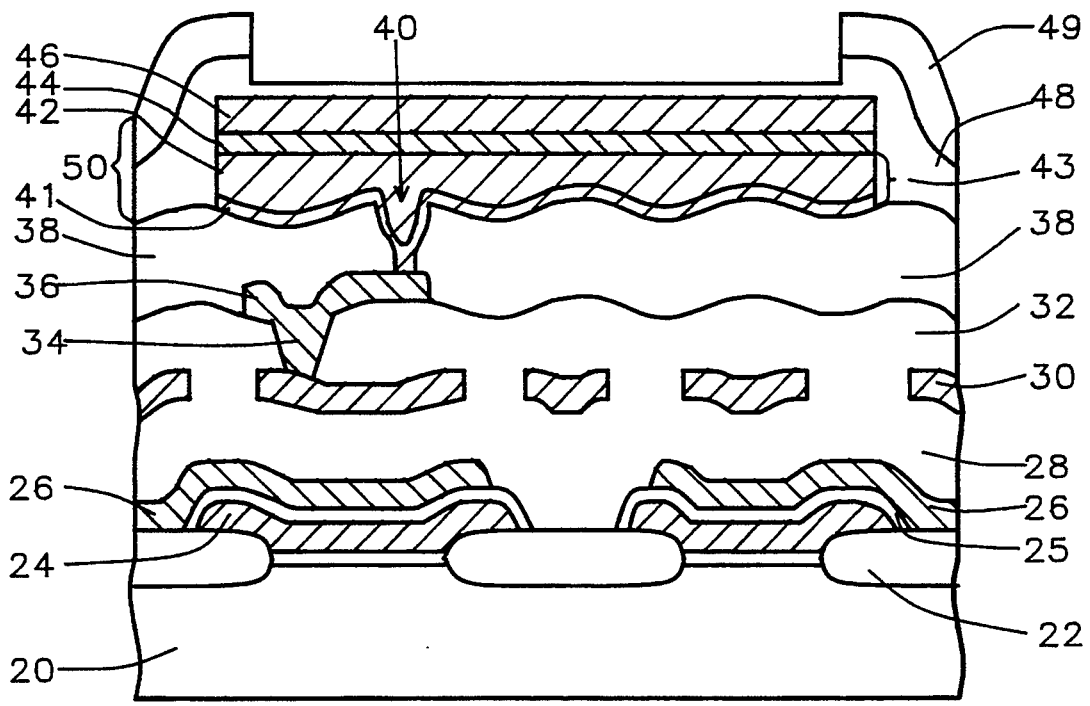
Figure 6:
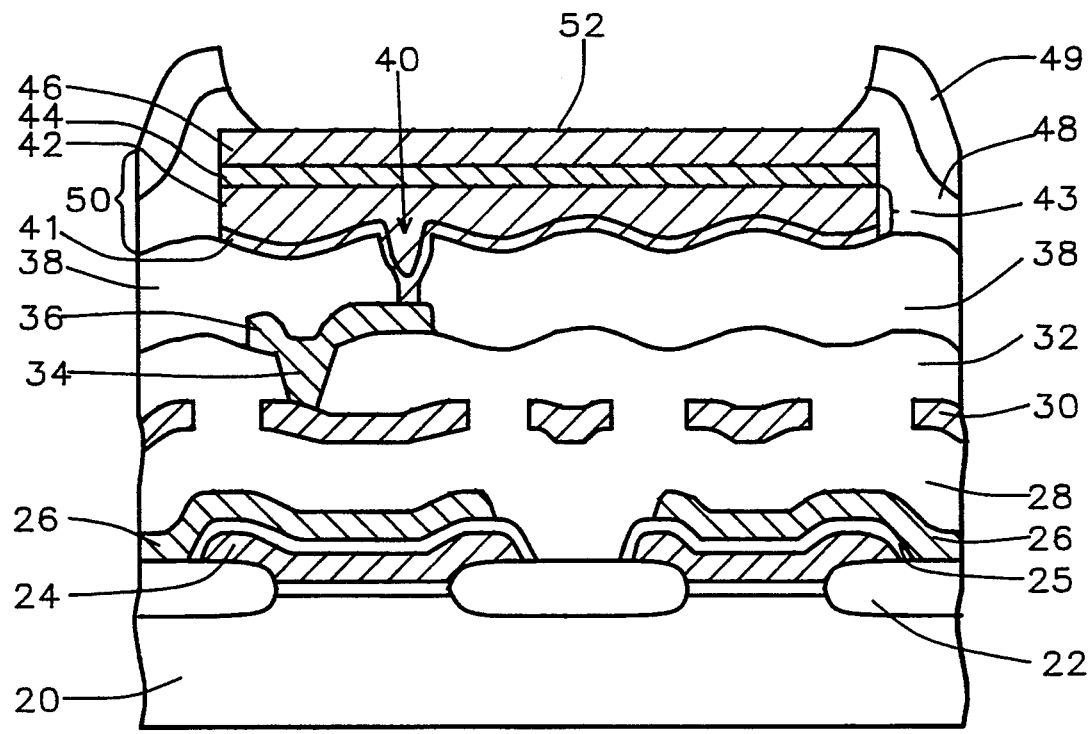

Referring now to FIGS. 5 and 6, a two-part etch is performed, to expose the metal reflector plate top surface. After conventional lithography and etching to define the area to be etched, a reactive ion etch is performed, to reduce the passivation layer 50 thickness to between about 500 and 1000 Angstroms in the region above the metal reflector plate. This is accomplished using a source gas that will etch both $SiO_x$ and $Si_3N_4$, such as $CF_4+O_2$ (carbon tetrafluoride+oxygen). The result is seen in FIG. 5. The second etch is a wet etch to remove the remainder of the passivation layer, which is $SiO_x$, over the metal reflector plate, as shown in FIG. 6. Buffered $HF/H_2O$ is used in this second etch to prevent pitting of the Al surface 52, which would occur if it were subjected to reactive ion dry etching conditions. The remaining photoresist is stripped with the completed structure as shown in FIG. 6.

The reflective layer may be defined for a wide range of size of metal reflector plates, depending upon the need of the virtual reality technologist who needs the integrated circuit have a reflective surface. The size of each reflective region 54, as seen in the FIG. 7 top view, can be smaller, the same size as, or larger than the I/O pads 60. Typical I/O pads are between about 90 and 120 micrometers on a side, to hundreds of micrometers on a side. The defined reflective surface might range from 15 micrometers on a side to hundreds of micrometers on a side. It is preferred for best planarity over the surface of the integrated circuit chip to have smaller rather than very large reflective regions 54.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing a highly reflective metal reflector plate on a semiconductor substrate, for virtual image projection, comprising the steps of:

forming above the semiconductor substrate a metal interconnection layer, an intermetal dielectric layer on said metal interconnection layer, and an opening through said intermetal dielectric layer to expose a portion of said metal interconnection layer;

forming a first metal layer on said intermetal dielectric layer and connecting to said metal interconnection layer through said opening;

forming a second metal layer on said first metal layer;

forming a third metal layer on said second metal layer;

forming a highly reflective metal layer on said third metal layer;

patterning said first, second, third and highly reflective metal layers to form said highly reflective metal reflector plate;

forming a passivation layer over said highly reflective metal reflector plate and exposed surface of said intermetal dielectric layer;

etching said passivation layer above said highly reflective metal reflector plate to leave a portion of said passivation layer over the entire top surface of said highly reflective metal reflector plate; and removing said portion of said passivation layer with a wet etch, to expose said highly reflective metal reflector plate.

2. The method of claim 1 wherein said first metal layer is cold sputtered aluminum formed at a temperature of between about 100° and 200° C., to a thickness of between about 1500 and 2000 Angstroms.

3. The method of claim 1 wherein said second metal layer hot sputtered aluminum formed at a temperature of between about 475° and 550° C., to a thickness of between about 2000 and 5000 Angstroms.

4. The method of claim 1 wherein said third metal layer is titanium, formed by cold sputtering to a thickness of between about 400 and 800 Angstroms.

5. The method of claim 1 wherein said highly reflective metal layer is pure aluminum formed at about 20° C., to a thickness of between about 2000 and 5000 Angstroms.

6. The method of claim 5 wherein said highly reflective metal layer is formed by cold sputtering.

7. The method of claim 1 wherein said forming a passivation layer comprises the steps of:

depositing a layer of phosphosilicate glass over said highly reflective metal reflector plate and exposed surface of said intermetal dielectric layer, to a thickness of between about 3000 and 5000 Angstroms; and depositing a layer of silicon nitride on said layer of phosphosilicate glass to a thickness of between about 3000 and 5000 Angstroms.

8. The method of claim 7 wherein said phosphosilicate glass is formed by plasma enhanced chemical vapor deposition at a temperature of less than about 400° C.

9. The method of claim 7 wherein said silicon nitride is formed by plasma enhanced chemical vapor deposition at a temperature of less than about 400° C.

10. The method of claim 1 wherein said etching said passivation layer is by reactive ion etching with carbon tetrafluoride and oxygen.

11. The method of claim 1 wherein said portion of said passivation layer has a thickness of between about 500 and 1000 Angstroms.

12. The method of claim 1 wherein said removing said portion with a wet etch is with buffered hydrofluoric acid.

13. A method of forming a highly reflective metal reflector plate for virtual image projection, over a memory cell with uneven topography, comprising the steps of:

forming a memory cell on a semiconductor substrate, with an uneven top surface formed of an insulating material;

forming an opening in said uneven top surface to expose an underlying metal interconnection line;

forming a first metal layer on said uneven top surface, connecting to said underlying metal interconnection line through said opening;

forming a second metal layer on said first metal layer;

forming a third metal layer on said second metal layer;

forming a highly reflective metal layer on said third metal layer;

patterning said first, second, third and highly reflective metal layers to form said highly reflective metal reflector plate;

forming a passivation layer over said highly reflective metal reflector plate and exposed surface of said intermetal dielectric layer;

etching said passivation layer above said highly reflective metal reflector plate to leave a portion of said passivation layer over the entire top surface of said highly reflective metal reflector plate; and removing said portion of said passivation layer with a wet etch, to expose said highly reflective metal reflector plate.

14. The method of claim 13 wherein said memory cell is for a static random access memory (SRAM).

15. The method of claim 13 wherein said memory cell is for a dynamic random access memory (DRAM).

16. The method of claim 13 wherein said first metal layer is cold sputtered aluminum formed at a temperature of between about 100° and 200° C., to a thickness of between about 1500 and 2000 Angstroms.

17. The method of claim 13 wherein said second metal layer hot sputtered aluminum formed at a temperature of between about 475° and 550° C., to a thickness of between about 2000 and 5000 Angstroms.

18. The method of claim 13 wherein said third metal layer is titanium, formed by cold sputtering to a thickness of between about 400 and 800 Angstroms.

19. The method of claim 13 wherein said highly reflective metal layer is aluminum formed at about 20° C., to a thickness of between about 2000 and 5000 Angstroms.

20. The method of claim 19 wherein said highly reflective metal layer is formed by cold sputtering.

21. The method of claim 13 wherein said forming a passivation layer comprises the steps of:

depositing a layer of phosphosilicate glass over said highly reflective metal reflector plate and exposed surface of said intermetal dielectric layer, to a thickness of between about 3000 and 5000 Angstroms; and depositing a layer of silicon nitride on said layer of phosphosilicate glass to a thickness of between about 3000 and 5000 Angstroms.

22. The method of claim 21 wherein said phosphosilicate glass is formed by plasma enhanced chemical vapor deposition at a temperature of less than about 400° C.

23. The method of claim 21 wherein said silicon nitride is formed by plasma enhanced chemical vapor deposition at a temperature of less than about 400° C.

24. The method of claim 13 wherein said etching said passivation layer is by reactive ion etching with carbon tetrafluoride and oxygen.

25. The method of claim 13 wherein said portion of said passivation layer has a thickness of between about 500 and 1000 Angstroms, 26. The method of claim 13 wherein said removing said portion with a wet etch is with buffered hydrofluoric acid.

* * * * *